United States Patent [19]

Lin

[11] Patent Number: 5,043,535
[45] Date of Patent: Aug. 27, 1991

[54] HERMETIC CERGLASS AND CERMET ELECTRONIC PACKAGES

[75] Inventor: Lifun Lin, Hamden, Conn.

[73] Assignee: Olin Corporation, New Haven, Conn.

[21] Appl. No.: 322,593

[22] Filed: Mar. 10, 1989

[51] Int. Cl.⁵ .......................................... H01L 23/02
[52] U.S. Cl. .................................... 174/52.4; 357/74
[58] Field of Search .................. 174/52.4, 52.3, 52.2, 174/52.1; 357/70, 72, 73, 74, 75, 80

[56] References Cited

U.S. PATENT DOCUMENTS

| 4,437,228 | 3/1984 | Yamamoto et al. | 29/590 |
| 4,480,262 | 10/1984 | Butt . | |
| 4,569,692 | 2/1986 | Butt | 75/235 |
| 4,594,770 | 6/1986 | Butt . | |
| 4,704,626 | 11/1987 | Mahulikar et al. | 357/74 |
| 4,711,826 | 12/1987 | Shapiro et al. | 428/630 |
| 4,715,892 | 12/1987 | Mahulikar | 75/233 |
| 4,743,299 | 5/1988 | Pryor et al. | 75/235 |
| 4,761,518 | 8/1988 | Butt et al. | 174/52.4 |
| 4,769,345 | 9/1988 | Butt et al. | 437/217 |
| 4,805,009 | 2/1989 | Pryor et al. | 357/70 |

FOREIGN PATENT DOCUMENTS 5586144  6/1980  Japan .

OTHER PUBLICATIONS

Military Standard 883C, Method 1014.5, entitled Seal, dated Aug. 25, 1983, pp. 1-9.
Metals Handbook (Ninth Edition), vol. 5, Surface Cleaning and Coating, 1982, pp. 300-302.

Primary Examiner—Leo P. Picard
Assistant Examiner—Bot Lee Ledynh
Attorney, Agent, or Firm—Gregory S. Rosenblatt; Paul Weinstein

[57] ABSTRACT

The invention relates to a process for coating sintered cermet or cerglass articles with a metal or metal alloy. The process is particularly useful to eliminate pores and cavities from the surface of the article. During hermeticity testing, these pores and cavities trap tracer gas and result in an erroneous leak rate measurement. In one embodiment, the coated surfaces are subsequently coated with a second metal layer by immersion plating followed by electrolytic deposition. The process is particularly suited to the manufacture of cermet and cerglass components for semiconductor packages.

6 Claims, 2 Drawing Sheets

HERMETIC CERGLASS AND CERMET ELECTRONIC PACKAGES

This invention relates to a process to produce improved cermet or cerglass electronic packages. More particularly, the invention relates to a method for sealing the outer surfaces of the packages to facilitate testing according to the hermeticity requirements of Military Standard 883C, Method 1014.5.

Integrated circuits, usually fashioned from a semiconductor material such as silicon or gallium-arsenide, are at the fore-front of the tremendous technological advances made in microelectronics during the past twenty years. These circuits are used for everything from computer memories to controlling household appliances. Simultaneous with the development of integrated circuits has been the development of packaging means for those circuits.

The packages protect the microelectronic devices from environmental corrosion and also electrically interconnect the devices to external circuitry. Depending on the desired end use of the devices, the degree of environmental protection required varies. In applications where high reliability is required, such as military or aerospace, Military Standard 883C, Method 1014.5 is frequently employed.

The purpose of Method 1014.5 of the Military Standard is to determine the effectiveness (hermeticity) of the seal of microelectronic and semiconductor packages having internal cavities. The method comprises inserting a sealed electronic package into a chamber which is pressurized with a helium tracer gas. If the package seal is defective, the tracer gas will accumulate within the internal cavity of the package. The package is subsequently placed in a vacuum and any gas emitted is detected and measured with a mass-spectrometer-type leak detector. The detector is calibrated so the detected gas may be converted into a leak rate measured in atmospheres cubic centimeters/ second of helium (atm cc/sec He). A leak rate above $5 \times 10^{-8}$ atm cc/sec He is deemed a reject under the Military Standard.

Electronic packages are manufactured from plastic, ceramic and metal components. Generally, only ceramic and glass sealed metal packages are able to achieve the desired level of hermeticity required for high reliability applications.

Perhaps the most common of the high reliability packages is the ceramic dual-in-line package or CERDIP. This package comprises a leadframe bonded between two pieces of ceramic by a sealing glass. The package is characterized by high reliability and hermeticity. However, the ceramic components are hard and brittle and are not readily fashioned into complex shapes. Further, the ceramic has relatively poor thermal dissipation capabilities.

One method of improving the formability and thermal dissipation of ceramic packaging components is through cerglass and cermet technologies. Cerglass technology comprises mixing ceramic particles and glass particles and, through the use of heat and pressure, sintering the particles into a coherent mass containing ceramic particles in a glass matrix. Frequently a metallic powder component is also added to the mix to improve the flow characteristics and to improve thermal conductivity. Prior to sintering, the powders may be poured into a mold of a desired shape so that intricately shaped articles may be formed.

Cermet technology is similar, except the ratio of particle types in the mixture is changed so that ceramic particles are bonded within a metal matrix. Frequently, a glass binder is added to the ceramic and metal particles to improve adhesion and permit lower temperature processing.

Cermet and cerglass processing is disclosed in U.S. Pat. No. 4,569,692 issued to Butt. The use of cerglass and cermets in electronic packaging is disclosed in U.S. Pat. No. 4,715,892 issued to Mahulikar and U.S. Pat. No. 4,743,299 issued to Pryor et al. U.S. Pat. No. 4,761,518 issued to Butt et al. discloses some of the processing advantages inherent in cermet and cerglass package components such as the ability to embed the leadframe into the base component to minimize stresses applied to the glass seal.

Electronic packages formed from cermet and cerglass technologies have better thermal dissipation properties than ceramic package components and may be formed into more complex shapes. Unfortunately, until now, the packages so formed have not been amenable to hermeticity testing in accordance with Military Standard 883C, Method 1014.5.

The ceramic particles usually have a particle size of from about 1 to about 200 microns and the metal particles usually have a particle size of from about 0.01 to about 50 microns. When pressed into a coherent mass, the packages do not leak and are believed to have leak rates less than the specified $5 \times 10^{-8}$ atm cc/sec He. The actual leak rate can not be measured since the surface of the sintered article contains surface pores which tend to trap helium. The helium gas escapes during leak testing resulting in an erroneous high detected leak rate.

Ceramic packaging components have been coated with a metallic layer to provide an electrically conductive surface. Such a structure is disclosed in Japanese Patent No. 55-86144 issued Jun. 6, 1980. However, that process of deposition is different from the present process. Further, the use of a metal layer to seal the surfaces of cerglass and cermet packaging components and the advantages achieved thereby such as the ability to subsequently electrolytically deposit a second metal layer have until now not been recognized.

Dry plating, also referred to as mechanical coating, is a process which utilizes kinetic energy to deposit a metallic coating on a part. The process is widely used to apply heavy coatings to metallic parts for corrosion protection. A more detailed description of the process may be found in Metals Handbook (Ninth Edition), Volume 5, *Surface Cleaning, Finishing, and Coating* at pages 300–302. The process has not been applied to ceramic based parts or for electronic packaging components.

Therefore, in accordance with the invention, a process to coat the surfaces of cerglass and cermet articles with a layer of a metal or metal alloy is provided. In a second embodiment, the soft metal powders used for the coating layer form a conductive surface upon which a second metal layer may be deposited by immersion plating or by electrolytic means. It is an advantage of the invention that the cermet or cerglass articles formed may be shaped into electronic packaging components. These packaging components may be tested for hermeticity in accordance with Military Standard 883C, Method 1014.5. It is a feature of the invention that the metal coating layer is deposited on the surface of the cermet or cerglass article by a dry plating operation. It is a further advantage of the invention that essentially any soft metal or metal alloy may be deposited by the techniques of the invention.

Accordingly, there is provided a method to reduce the surface porosity of sintered cermet and cerglass articles comprising the steps of first providing a dry plating mixture. The mixture comprises the sintered articles preformed to a desired shape and a slurry containing ceramic or glass beads, the metal or metal alloy coating material in powder form and a dispersing medium such as water. The mixture is then agitated for a time sufficient to embed the coating material into the surfaces of the sintered articles. The articles so sealed are testable according the to desired hermeticity test. Further, the articles so sealed are in condition for the deposition of a second metal if so desired.

The above stated objects, features and advantages as well as other objects, features and advantages of the invention will be made more clear by the following drawings and specification.

IN THE DRAWINGS

Figure 1:
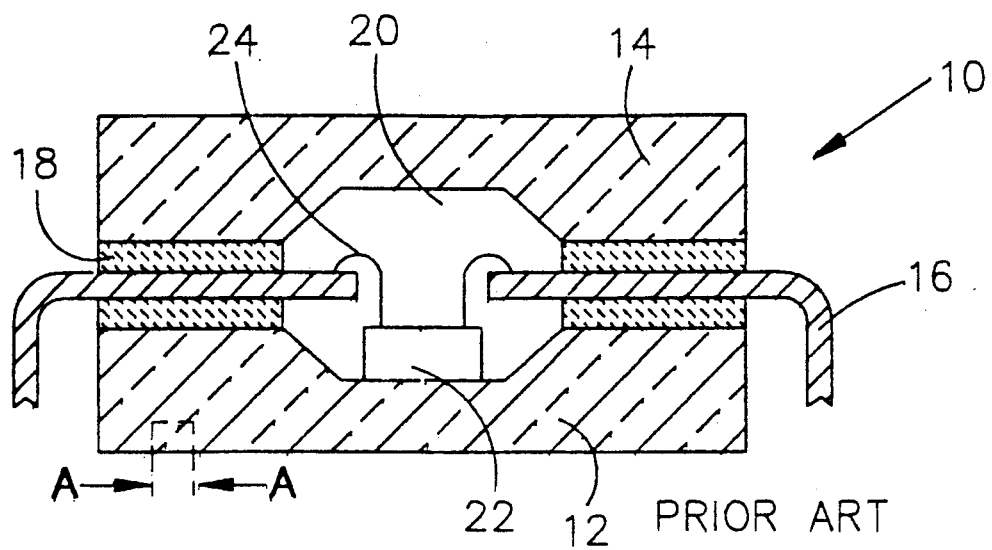
FIG. 1 illustrates in cross section a cermet or cerglass electronic package as known in the art.

FIG. 1 illustrates in cross section, a cermet or cerglass package 10 as known from the prior art. The package 10 comprises a base component 12 and a cover component 14. The base component and cover component are formed by combining the desired ratio of precursor powders, pouring the mixture into a mold having a desired shape and forming the mixture into a coherent mass by the proper application of heat and pressure.

For example, a mixture comprising from about 30 volume percent to about 65 volume percent of a metallic powder such as aluminum or an aluminum based alloy having a particle size of from about 3 microns to about 25 microns may be mixed with a ceramic, such as aluminum oxide, having a particle size of from about 10 microns to about 40 microns to produce a cermet having a relatively high coefficient of thermal expansion, i.e. between about $140 \times 10^{-7}$ to about $170 \times 10^{-7}$ in./in/°C. The mixture is placed in a mold having a desired shape and compacted at from about 15 to about 25 tons of pressure. The green density of the compact is about 88%. The compact is degassed at about 400° C. and then sintered at about 600° C. for 24 hours. The so formed article has a post sintering density of about 92%.

Disposed between the base component 12 and the cover component 14 is a leadframe 16. The leadframe 16 serves to electrically interconnect an electronic device to external circuitry. The leadframe 16 is bonded to both the base component 12 and the cover component 14 by a sealing glass 18. The sealed package 10 forms a cavity 20 for housing an electronic device 22. Lead bond wires 24 connect the electronic device 22 to the leadframe 16.

Figure 2:
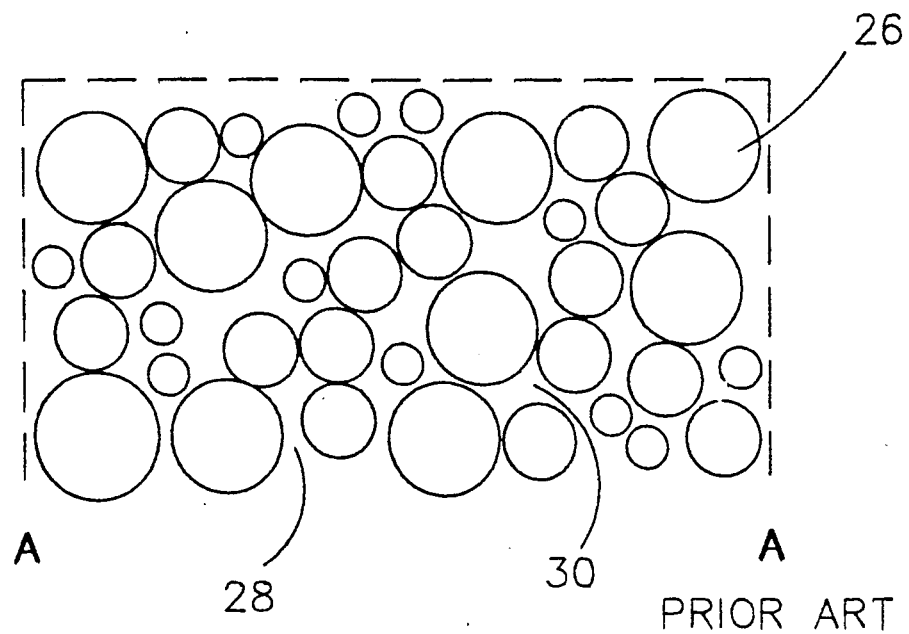
FIG. 2 illustrates in cross section the surface of a prior art cermet or cerglass electronic package component under high magnification.

FIG. 2 represents a highly magnified, stylized view of a portion of the base component 12 of FIG. 1. The section is represented as "A" in FIG. 1. As shown in FIG. 2, the cermet or cerglass structure is comprised of a plurality of densely packed ceramic and metal particles 26. The particles vary in size from about 0.01 microns to about 100 microns. The particles are drawn as circular, but this shape is idealized for the purpose of description only. Particle size distribution may be controlled by sifting with appropriate mesh screens prior to sintering.

As the particles 26 are discrete, pores 28 are inherent between particles. These pores are sometimes interconnected to form internal cavities 30. Due to the small size of the particles 26 and the large number of particles required to form the packaging components, the likelihood of a series of connecting pores extending to the package cavity is quite remote. However, a tracer gas may be entrapped during leak testing and erroneously lead to the conclusion the pores extend to the internal cavity 20 and the part in not hermetic.

A low melting temperature glass component may be utilized. The glass component melts during sintering and fills in most of the cavities. However, a certain number of pores remain. The pores 28 and internal cavities 30 trap helium and result in an erroneous leak rate reading during hermeticity testing.

Figure 3:
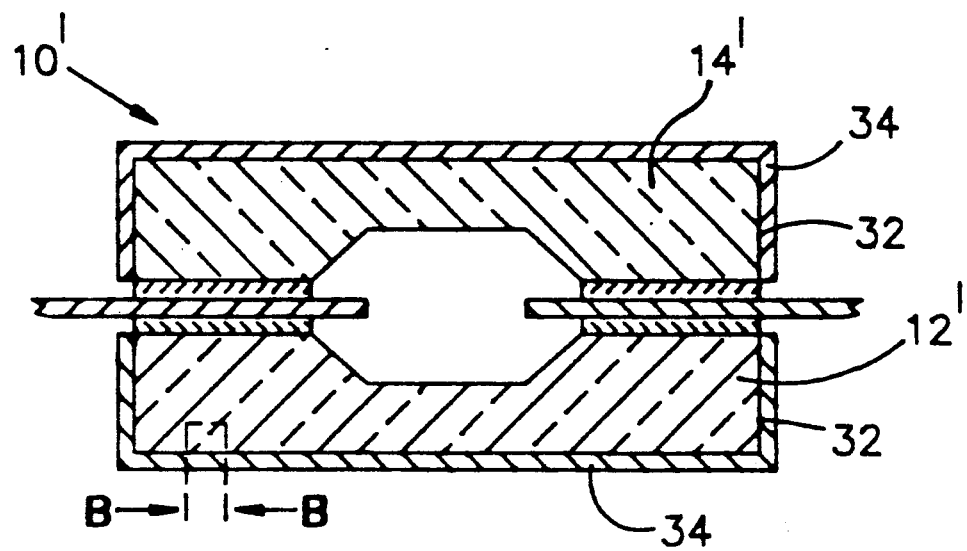
FIG. 3 illustrates in cross section a coated cermet or cerglass electronic package component in accordance with the invention.
Figure 4:
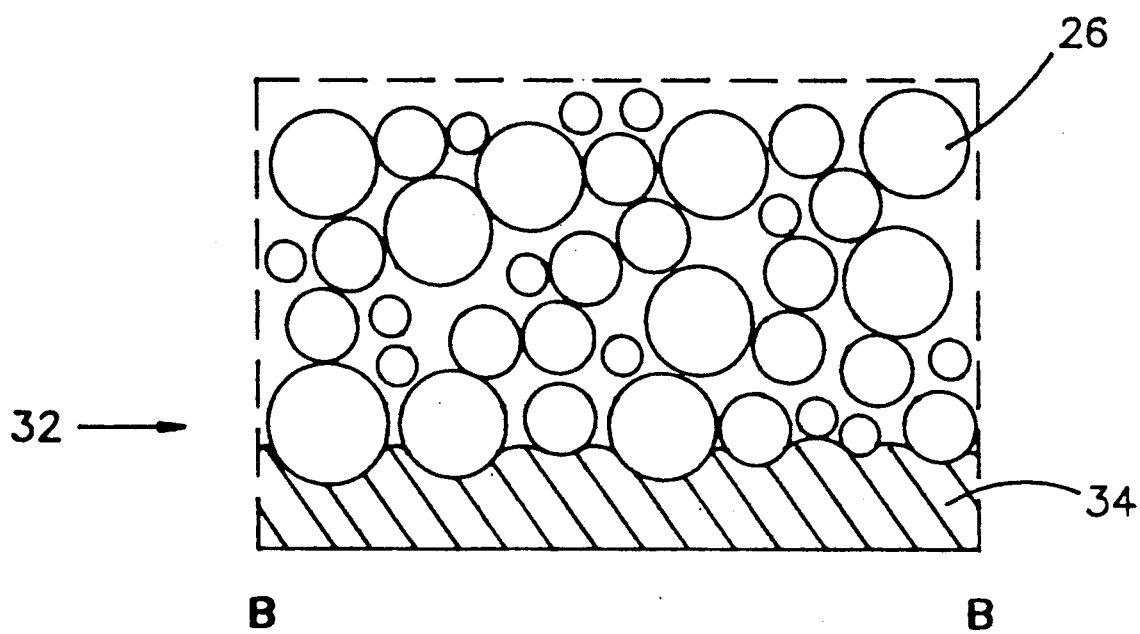
FIG. 4 illustrates in cross section the surface of a cermet or cerglass electronic package component coated according to the invention.

FIG. 3 shows in cross section, a cermet or cerglass package 10' including a base component and cover component 14' 12' in accordance with the invention. The exterior surfaces 32 of the package has been coated with a layer of metal 34. FIG. 4 is a highly magnified, stylized view of region "B" of FIG. 3. The surface 32 is embedded with a fine metal or metal alloy powder 34 which coats the pores and internal cavities located along the edge of the package component. When these external pores and cavities are filled, helium is not trapped and the part may be leak tested according to the Military Standard.

In accordance with the invention, the process for depositing the metal layer 34 is as follows. A plurality of parts are formed by combining the desired mixture of ceramic, glass and metal particles. As described hereinabove, the volume percent ratio of particles is selected to achieve certain desired properties such as a specific coefficient thermal expansion. The mixture is pressed into a mold having a desired shape to form parts and then densified as by sintering. The cerglass or cermet parts have pores which are coated by placing the parts in a rotating barrel along with a desired coating material, a plurality of beads and a dispersing medium.

The coating material is a metal or metal alloy powder with a particle size of from about 0.1 microns to about 100 microns and preferably from about 1 micron to about 10 microns. The particular size distribution selected is based the size of the pores in the cerglass and cermet packaging part. The composition of the coating powder is selected to be any readily deformable metal or metal alloy powder. Preferred powder compositions are aluminum, zinc, tin, cadmium, indium and alloys of the metals. Aluminum and its alloys are most preferred because these materials are compatible with an aluminum/aluminum oxide based cermet or cerglass part.

Glass or ceramic beads supply the kinetic energy to mechanically deform the metal powder and press the powder into the pores and cavities of the cermet or cerglass surface. The size of the beads is selected to be from about 1 millimeter to about 10 millimeters and most preferably from about 3 millimeters to about 7 millimeters. The beads may be any glass or ceramic which is harder than the metal or metal alloy powder. The beads are preferably as dense as possible to maximize the force of impact. The beads should be composed of a material which does not react with any of the other components of the mixture. A preferred material for the beads is ceramic coated glass.

A slurry comprising the beads, metal or metal alloy coating powder, cermet or cerglass parts and a dispersing medium such as water is introduced into a barrel capable of rotation. The distribution of material within the barrel is from about 1 volume percent to about 5 volume percent cermet or cerglass parts, from about 5 volume percent to about 50 volume percent beads and metallic coating powder and the remainder the dispersing medium. The optimum ratio is dependent on the density of the cermet or cerglass parts, final coating thickness desired and hardness of the coating powder selected.

The mixture is then rotated for a time sufficient to deposit a metal coating layer on the surface of the cermet or cerglass. A preferred rotation time is from about 30 minutes to about 60 minutes. The rotation time is selected to preferably deposit a coating layer 34 having a thickness of from about 5 microns to about 8 microns.

The method of the invention has several advantages over other coating methods such as electrodeposition, vapor deposition or sputtering. The method is suitable for coating a plurality of intricately shaped parts simultaneously. The metal or metal alloy powder may be any desired composition. All materials may be recycled. The beads and metal powder may be separated by a sieving operation. There is no waste problem such as spent electrolyte. The plated parts are not subject to hydrogen embrittlement.

While the method of the invention is applicable for depositing coating layers of up to about 75 microns on the surface of the cermet or cerglass, relatively thick metal layers are preferably deposited by a combination of the above process and electrolytic deposition.

A thin metal or metal alloy layer is deposited by the method described hereinabove. The preferred coating material is aluminum or aluminum alloys due compatibility with the parts as discussed hereinabove. The coated cermet or cerglass part then has an electrically conductive surface around the entire outside edge and may be electroplated by conventional barrel or rack electroplating techniques.

For example, the cermet or cerglass parts coated with an about 50 micron layer of aluminum may be immersed in a solution containing from about 100 to about 500 grams per liter of sodium hydroxide and from about 80 to about 100 grams per liter zinc oxide to immersion plate a layer of zinc. Once a thin zinc layer is deposited, electrolytic plating may be commenced using any commercially available solution. The electrolytic deposition rate is typically from about 1 to about 13 microns per minute so a layer of 100 microns thick may readily be deposited within a relatively short time. The electrolytic deposition may be any suitable material, for example copper, nickel, gold or tin as well as the alloys of the metals.

The metal coating permits the parts to be soldered if desired. Further, by depositing a layer of copper or other thermally conductive material, the thermal conductivity of the overall part is improved.

While the method has been particularly described for cermet and cerglass parts for use in electronic packages and the advantage of improved hermeticity stressed, the process is applicable to cermet or cerglass parts used for other applications as well. As detailed above, a solderable surface may likewise be applied to a cermet or cerglass structure by the above method.

The patents, patent application and publication set forth in the specification are incorporated by reference herein.

It is apparent that there has been provided in accordance with the invention a process to coat the surface of cermet and cerglass articles to minimize helium entrapment and to facilitate further metal deposition which fully satisfies the objects, means and advantages set forth hereinbefore. While the invention has been described in combination with specific embodiments thereof, it is evident that many alternatives, modifications and variations will be apparent to those skilled in the art in light of the foregoing description. Accordingly, it is intended to embrace all such alternatives, modifications and variations which fall within the broad scope of the appended claims.

I claim:

1. A semiconductor package for housing an electronic device, comprising:
   a base component comprised of a cermet or cerglass material;
   a cover component comprised of a cermet or cerglass material;
   a metal coating layer sealing the exterior surfaces of said cermet or cerglass materials;
   a leadframe disposed between said base component and said cover component; and
   a sealing glass bonding said leadframe to said base component and to said cover component.

2. The semiconductor package of claim 1 wherein said metal coating layer is partially embedded in said exterior surfaces.

3. The semiconductor package of claim 2 wherein said coating layer is selected from the group consisting of aluminum, zinc, tin, cadmium, indium, their alloys and mixtures thereof.

4. The semiconductor package of claim 3 wherein said metal coating layer is selected to be aluminum.

5. The semiconductor package of claim 3 wherein said metal coating layer is coated with a layer of a second metal.

6. The semiconductor package of claim 5 wherein said second metal is selected from the group consisting of copper, nickel, gold, tin and alloys thereof.

* * * * *